United States Patent [19]

Kamiyama

[11] Patent Number: 4,734,379

[45] Date of Patent: Mar. 29, 1988

[54] METHOD OF MANUFACTURE OF SOLAR BATTERY

[75] Inventor: Michinari Kamiyama, Yokosuka, Japan

[73] Assignee: Fuji Electric Corporate Research and Development Ltd., Japan

[21] Appl. No.: 908,032

[22] Filed: Sep. 16, 1986

[30] Foreign Application Priority Data

Sep. 18, 1985 [JP] Japan .................................. 60-205591

[51] Int. Cl.⁴ ............................................. H01L 31/18
[52] U.S. Cl. ..................................... 437/002; 136/244; 136/249; 136/258; 437/51; 437/205
[58] Field of Search ................. 29/572, 580, 583, 591; 136/244, 249 MS, 258 AM; 437/2, 4, 51, 205

[56] References Cited

U.S. PATENT DOCUMENTS

| | | | |
|---|---|---|---|
| 4,396,793 | 8/1983 | Madan .................................. | 136/255 |
| 4,407,695 | 10/1983 | Deckman ............................. | 156/643 |
| 4,461,922 | 7/1984 | Gay et al. ........................ | 136/249 TJ |
| 4,517,403 | 5/1985 | Morel et al. ................... | 136/249 MS |
| 4,528,065 | 7/1985 | Yamazaki ............................. | 156/643 |
| 4,532,537 | 7/1985 | Kane ...................................... | 357/30 |
| 4,570,332 | 2/1986 | Yamauchi ............................ | 437/170 |
| 4,581,476 | 4/1986 | Yamazaki .................... | 136/258 AM |
| 4,591,892 | 5/1986 | Yamazaki ............................... | 357/30 |

FOREIGN PATENT DOCUMENTS

| | | | |
|---|---|---|---|
| 59-54274 | 3/1984 | Japan ........................... | 136/258 AM |
| 59-52883 | 3/1984 | Japan ........................... | 136/258 AM |
| 59-86269 | 5/1984 | Japan ................................... | 136/261 |
| 59-94884 | 5/1984 | Japan ................................... | 136/261 |
| 59-107579 | 6/1984 | Japan ................................... | 136/290 |
| 59-220978 | 12/1984 | Japan ................................... | 136/244 |

OTHER PUBLICATIONS

P. G. Lasswell et al., *Conf. Record, 15th IEEE Photovoltaic Specialists Conf.* (1981), pp. 1021–1024.

H. Bohlen et al., Method of Improving The Adhesion of Copper On A Plastic Laminate, IBM Tech. Disclosure Bulletin, vol. 26, No. 2, Jul. 1983, pp. 673–674.

*Primary Examiner*—Arron Weisstuch
*Attorney, Agent, or Firm*—Stevens, Davis, Miller & Mosher

[57] ABSTRACT

A solar battery having a plurality of photoelectric conversion elements connected in series. Each element consists of a transparent electrode layer, a non-crystalline semiconductor layer and a metal electrode layer laid one upon another in the stated order. In one embodiment, a site comprising a polycrystalline region is provided in the non-crystalline semiconductor. A conductive element sandwiches the transparent electrode between it and said non-crystalline material directly beneath said site. In another embodiment, a void which is filled with metal from said metal electrode layer connects the metal electrode layer and the underlying transparent electrode. Methods of manufacturing the solar battery including laser irradiation to form the polycrystalline region or void are disclosed.

10 Claims, 7 Drawing Figures

METHOD OF MANUFACTURE OF SOLAR BATTERY

BACKGROUND OF THE INVENTION

This invention relates to a film type solar battery comprising a plurality of series-connected photoelectric conversion elements formed on a translucent insulated substrate.

Non-crystalline or amorphous silicon (hereinafter referred to as "a—Si") is formed by subjecting silane gas to glow discharge decomposition. Because a—Si grows in the gaseous phase, it theoretically can readily have a large area. It is hoped that non-crystalline silicon can be developed as a high output element in a solar battery.

In order to efficiently use the electric power generated by a solar battery, it is desirable that the structure of the solar battery be as shown in FIG. 2, for example, where unitary cells are connected in series to one another. In a solar battery of the type shown in FIG. 2, strip-shaped transparent electrodes 21, 22, 23, 24 and so on are formed on a translucent insulated substrate 1 such as a glass substrate. For example, an ITO (indium tin oxide) film, $SnO_2$ (tin oxide) film, or $ITO/SnO_2$ compound film is formed on the entire upper surface of the glass substrate 1 by electron beam vacuum deposition, sputtering, or thermal chemical vapor deposition (CVD), and the film thus formed is subjected to optical etching to form the strip-shaped transparent electrodes 21, 22, 23, 24 and so on. In the same manner, a—Si layers 31, 32, 33, 34 and so forth and metal electrodes 41, 42, 43, 44 and so forth are formed. In order to electrically connect the transparent electrode layers to the metal electrode layers, the metal electrode 41 is brought into contact with transparent electrode layer 22, the metal electrode 42 is brought into contact with the transparent electrode layer 23 and the metal electrode 43 is brought into contact with the transparent electrode layer 24, and so on until all the corresponding metal electrodes are brought into contact with their corresponding transparent electrode layer. Each of the a—Si layers 31, 32, 33, 34 and so on consists of a p-layer of about 100 Å in thickness, a non-doped (i) layer 0.5 um in thickness, and an n-layer of about 500 Å in thickness which are laid one on another in the stated order as viewed from the side of the transparent electrode.

However, the manufacture of the above-described series connection type solar battery of the prior art suffers from the following difficulties:

(1) Pinholes are liable to be formed because of defects in photo-resist layers, thus decreasing the output power of the solar battery;

(2) A chemical treatment is carried out for every film formation, which contaminates the interfaces of the films, thus lowering the output power of the solar battery; and (3) The manufacturing processes are intricate, and thus the manufacturing cost is increased as the area of the solar battery increases.

In order to eliminate the above-described difficulties, a method has recently been proposed in the art in which the energy of a laser beam is utilized to cut the transparent electrode layer, the a—Si layer and the metal electrode layer into pieces.

Additionally, the present inventors have described a method in Japanese Patent Application No. 213736/1984 in which the a—Si layer is not cut, but instead electrically conductive polycrystalline regions are formed in the a—Si layer by utilizing the energy of a laser beam so that the transparent electrode layer of any one of the photoelectric conversion elements is connected to the metal electrode layer of the next photoelectric conversion element. However, as is described in the specification of the above mentioned patent application, there are several cases where the applied laser beam is either not absorbed or is excessively absorbed. For example, in both cases where the laser beam is applied to the a—Si layer through the metal electrode layer or applied directly to the a—Si layer before the metal electrode layer is formed, a non-uniform thickness in either the a—Si layer or the metal electrode layer causes reflection of the beam to fluctuate. This results in the laser beam being reflected by the layer or passed through it in an unpredictable manner. As a result, the energy necessary for forming polycrystalline regions in the a—Si layer is not absorbed therein, or, in the alternative, the energy of the laser beam is excessively absorbed therein, so that the a—Si layer may be cut and the transparent electrode layer may also be cut. The problems associated with over or under absorption of light are evident. When the a—Si layer is not made polycrystalline, it is so high in resistance that the metal electrode layer on the a—Si layer is not electrically connected to the transparent electrode layer. If the transparent electrode layer is also cut, the electrical connection cannot be obtained. Even if the metal electrode layer is formed later so that the gap formed by cutting of the transparent electrode layer is filled with metal, the metal layer in the gap is brought into contact only with the cross-sectional areas of the transparent electrode layer. The resulting contact area is extremely small such that it is impossible for the metal electrode layer to sufficiently electrically contact the transparent electrode layer. Accordingly, it is necessary for the prior art to monitor and adjust the laser output according to the conditions of the layers, which lowers the manufacturing efficiency in the mass production of solar batteries.

OBJECTS OF THE INVENTION

An object of this invention is to provide a film type solar battery suitable for mass production in which the above-described difficulties have been eliminated.

It is a further object of this invention to form polycrystalline regions in an a—Si layer by a laser beam to connect the photoelectric conversion elements, wherein adjustment of the laser output is unnecessary.

SUMMARY OF THE INVENTION

The foregoing objects of the invention have been achieved by the provision of a film type solar battery in which polycrystalline regions for connecting photoelectric conversion elements are formed in a non-crystalline semiconductor layer. These regions are covered by elongated portions of the metal electrode layers of adjacent photoelectric conversion elements. According to the invention, conductive layers are provided between a translucent insulated substrate and the transparent electrode layers under the polycrystalline regions, to sandwich the transparent electrode between itself and the semiconductor layer, whereby, even if the non-crystalline semiconductor layer and the transparent electrode layer are cut by the excessively large energy of a laser beam, the gaps formed in these layers are filled with the metal of the metal electrode layer to electrically connect the photoelectric conversion elements to one another.

DETAILED DESCRIPTION OF THE INVENTION

Figure 1A:
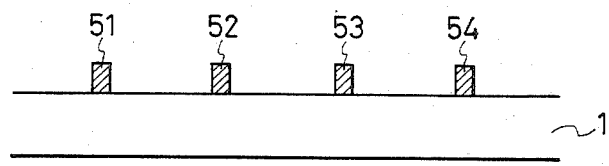
FIGS. 1a-1d are sectional views showing the steps of manufacturing a film type solar battery in one embodiment of this invention.

The parts (a) through (d) of FIG. 1 schematically illustrate the steps of manufacturing a film type solar battery in sequence, in one embodiment of the present invention. In FIG. 1, parts corresponding functionally to those already described with reference to FIG. 2 are therefore designated by the same reference numerals or characters.

Figure 2:
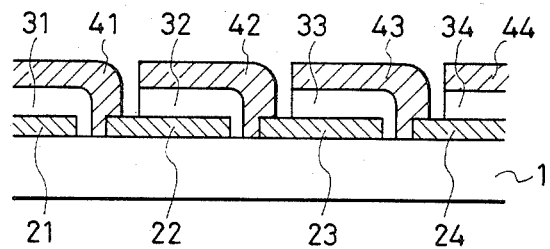
FIG. 2 is a sectional view showing a conventional film type solar battery.

FIG. 1a illustrates a pattern of a conductive layer according to one embodiment of the invention. In FIG. 1a, conductive films 51, 52, 53, 54 and so forth are formed by printing the conductive films on a glass substrate 1 with conductive paste containing silver by a screen printing technique, followed by sintering at about 500° C. for about ten minutes.

Figure 1B:
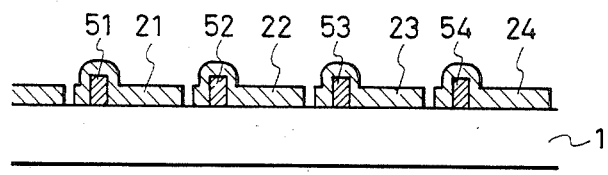

Thereafter, a transparent electrode layer is formed to a thickness of 0.4 to 1 μm by an electronic beam vacuum deposition method of hot CVD method in such a manner as to cover all the conductive films. The transparent electrode layer thus formed is scanned with a yttrium-aluminum-garnet (YAG) laser beam about 50 μm in diameter in such a manner that the laser beam is applied along a line about 20 μm to the left of each of the conductive films 51, 52, 53, 54 and so forth, thereby to pattern (form) transparent electrodes 21, 22, 23, 24 and so forth as shown in FIG. 1B. A suitable output power of the laser in this operation is $2 \times 10^5$ to $5 \times 10^5$ W/cm$^2$.

Next, an a—Si layer 3 is formed consisting of a p-layer about 100 Å in thickness, an i-layer about 0.5 μm in thickness, and an n-layer of about 500 Å in thickness laid one over the other in the stated order as viewed from the side of the transparent electrodes. These layers are formed in the stated manner so as to cover all the transparent electrodes. The p-layer can be formed by decomposing a reaction gas which is formed by mixing about 1% $B_2H_6$ with $SiH_4$ and subjecting the gas to glow discharge. The i-layer can be formed by decomposing $SiH_4$ by the same technique. The n-layer can be formed by decomposing a gas which is prepared by mixing about 1% $PH_3$ with $SiH_4$.

Figure 1C:
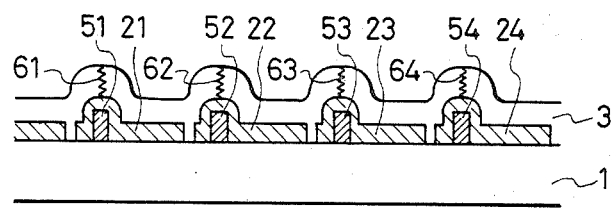
Figure 1D:
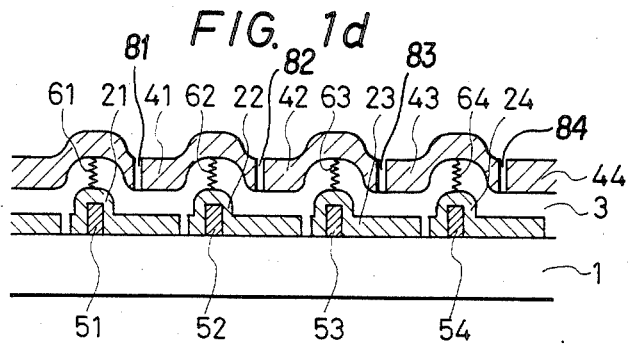

A laser beam of about 50 μm in diameter is then applied to the a—Si layer 3 formed over the conductive films 51, 52, 53, 54 and so on as described above. The power of the applied laser beam is $2 \times 10^5$ W/cm$^2$ or less, preferably $0.5 \times 10^5$ to $2 \times 10^5$ W/cm$^2$. As a result, the a—Si layer becomes molten and evaporates at irradiated regions 61, 62, 63, 64 and so forth and the heat produced in this operation makes the irradiated regions polycrystalline in the direction of the thickness of the a—Si layer 3 as shown in FIG. 1c. Thereafter, a metal electrode layer, for example, aluminum, is formed on the a—Si layer 3 by an electronic beam vacuum deposition or sputtering method. Irradiated regions 61, 62, 63, 64 of the a—Si layer which have been made polycrystalline are low in resistance, having a conductivity 1,000 times that of the surrounding a—Si layer. Thus, the metal electrode layer of aluminum or the like is electrically connected to the transparent electrodes through the polycrystalline regions 61, 62, 63, 64 as shown in FIG. 1d. Thereafter, the metal electrode layer is scanned with a laser beam about 50 μm in diameter in such a manner that the laser beam is applied along a line on the righthand side of each of the polycrystalline regions, thereby to pattern or form individual metal electrodes 41, 42, 43, 44. For this operation, a suitable power of the laser beam was found to be $5 \times 10^6$ to $10 \times 10^6$ W/cm$^2$, and the separation belts 81, 82, 83, 84, or material removed from between the electrodes 41, 42, 43, 44 were found to be about 40 μm in width.

Figure 3A:
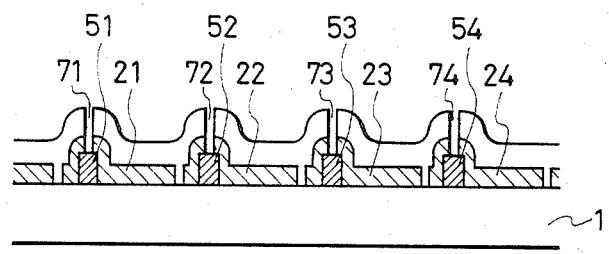
FIGS. 3a-3b are sectional views showing an abnormal condition occurring in the steps of manufacturing the solar battery shown in FIG. 1.
Figure 3B:
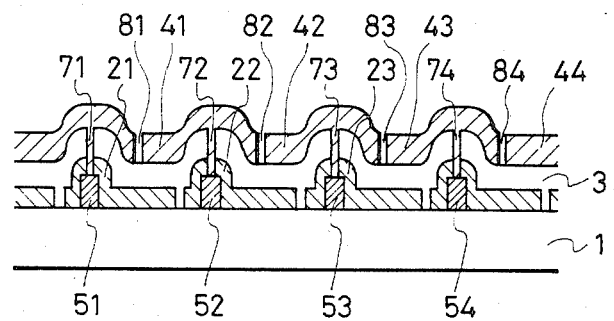

Conductive films 51, 52, 53, 54 formed on the glass substrate 1 absorb the energy of the laser beam which otherwise may be lost, thus contributing to the formation of the polycrystalline regions in the a—Si layer. Even if the energy of the laser beam utilized is so large that, as shown in FIG. 3a, the a—Si layer 3 and the transparent electrodes 21, 22, 23, 24 are cut to form gaps 71, 72, 73, 74, FIG. 3a, these gaps are filled with metal in the subsequent step of forming the metal electrode layer. As shown in FIG. 3b, the metal electrodes 41, 42, 44 are connected to the transparent electrodes 21, 22, 23, through a metal, such as aluminum, which fills in the gaps 72, 73, 74. Thus, when the power of the laser beam is sufficiently large for the formation of the polycrystalline regions in the a—Si layer, but the absorption is excessive and cuts through the a—Si layer then the elements can be connected in series to one another no matter how non-uniform the surface and thickness of the a—Si layer 3 when employing the method of the present invention.

The characteristics of a solar battery consisting of ten series-connected photoelectric conversion elements formed on a glass substrate 1 by the process as described above were $V_{oc}=8.4$, $I_{sc}=130$ mA, FF$=0.65$, and output$=710$ mW.

In the above-described embodiment, the conductive films 51, 52, 53, 54 are formed by printing them on the substrate with a conductive paste; however, they may also be formed by vacuum-depositing metal through a mask. They may also be formed by depositing a metal film layer which is thereafter subjected to patterning. However, since the a—Si layer is formed over them, these conductive films should be resistant to temperatures as high as about 500° C. so as to withstand the temperature which is used in forming the a—Si layer. Moreover, the conductive film should be scarcely scattered when irradiated by the laser beam.

In the solar battery produced by the method of the invention, a conductive layer 51, 52, 53, 54 is provided between the translucent insulated substrate 1 and the transparent electrode layer 21, 22, 23, 24 with each conductive layer positioned below its respective polycrystalline region 61, 62, 63, 64 of a—Si layer 3. The conductive layer 51, 52, 53, 54 also prevents the transmission of the laser beam through the transparent substrate 1. Thus, even when the non-crystalline semiconductor layer and the transparent electrode layer are cut by an excessively large energy or absorption of the laser beam, the present battery will still contain an electrical connection between the metal electrodes 41, 42, 43, and 44 and their respective transparent electrodes 21, 22, 23 and 24. Accordingly, even if, for instance, the non-crystalline semiconductor layer is not uniform in thickness or its surface fluctuates in reflection factor, sites for polycrystalline regions can be formed in the non-crystalline semiconductor layer by using the same laser beam. Even if the site comprises a void, the subsequent metal layer forming step will provide the electrical connection with the transparent electrode. Thus, automation of the manufacture of the solar battery of the invention can be readily achieved.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

I claim:

1. The method of forming a solar battery comprising the steps of:
   (a) providing a substrate;
   (b) depositing a conductive film on said substrate;
   (c) forming a transparent electrode substantially covering said conductive film;
   (d) depositing a non-crystalline material on said transparent electrode;
   (e) exposing at least one site on the non-crystalline material to light of intensity sufficient to form a low resistance polycrystalline region or a void in said non-crystalline layer; and
   (f) forming a metal electrode on said non-crystalline material overlying said site.

2. The method of claim 1, wherein said exposing of step (e) forms a void at said site and further comprising the step of filling the void with metal extending from said metal electrode.

3. The method of claim 2, wherein said void extends through said non-crystalline layer and said transparent electrode and said step of filling electrically connects the metal electrode to said conductive film.

4. The method of claim 1, wherein said depositing of step (b) comprises printing the conductive film on the substrate and further comprises the step of sintering the film for about 10 minutes at about 500° C.

5. The method of claim 4, wherein said printing comprises printing a plurality of spaced apart conductive films and the forming of step (c) comprises covering all the conductive films.

6. The method of claim 5, further comprising the step of scanning the transparent electrode layer with light of intensity sufficient to pattern the transparent electrode layer into a plurality of transparent electrodes.

7. The process of claim 1, wherein the depositing of step (d) comprises decomposing a reaction gas comprising $SiH_4$ to form said non-crystalline material.

8. The process of claim 7, wherein the reaction gas also contains a member selected from the group consisting of $B_2H_6$ and $PH_3$.

9. The process of claim 1, wherein said exposing of step (e) comprises exposing the non-crystalline material to a laser beam.

10. The process of claim 1, wherein said metal electrode comprises aluminum.

* * * * *